United States Patent [19]
Spikes, Jr. et al.

[11] Patent Number: 6,074,904
[45] Date of Patent: Jun. 13, 2000

[54] METHOD AND STRUCTURE FOR ISOLATING SEMICONDUCTOR DEVICES AFTER TRANSISTOR FORMATION

[75] Inventors: Thomas E. Spikes, Jr., Round Rock; Mark W. Michael; Mark I. Gardner, both of Cedar Park; Robert Dawson, Austin, all of Tex.

[73] Assignee: Advanced Micro Devices, Inc., Sunnyvale, Calif.

[21] Appl. No.: 09/063,796

[22] Filed: Apr. 21, 1998

[51] Int. Cl.[7] .............................................. H01L 21/8238
[52] U.S. Cl. ...................... 438/223; 438/218; 438/221; 438/224; 438/230; 438/231
[58] Field of Search ..................... 438/231, 218, 438/221, 223, 224, 230, 232

[56] References Cited

U.S. PATENT DOCUMENTS

| | | | |
|---|---|---|---|
| 5,387,534 | 2/1995 | Prall | 438/287 |
| 5,677,224 | 10/1997 | Kadosh et al. | 438/231 |
| 5,827,761 | 10/1998 | Fulford, Jr. et al. | 438/199 |
| 5,849,621 | 12/1998 | Gardner et al. | 438/279 |
| 5,874,328 | 2/1999 | Liu et al. | 438/224 |
| 5,877,050 | 3/1999 | Gardner et al. | 438/231 |

*Primary Examiner*—Trung Dang
*Attorney, Agent, or Firm*—Kevin L. Daffer; Conley, Rose & Tayon

[57] ABSTRACT

A method for isolating semiconductor devices comprising providing a semiconductor substrate. The semiconductor substrate includes a first pair of source/drain regions on either side of a first channel region and a second pair of source/drain regions on either side of a second channel region. One of the first pair of source/drain regions is proximal to one of the second pair of source/drain regions. First and second laterally displaced MOS transistors are formed partially within the semiconductor substrate. An isolation trench is formed through the proximal source/drain regions and the trench is filled with a trench dielectric material such that the proximal source/drain regions are electrically isolated whereby the first transistor is electrically isolated from the second transistor.

19 Claims, 5 Drawing Sheets

METHOD AND STRUCTURE FOR ISOLATING SEMICONDUCTOR DEVICES AFTER TRANSISTOR FORMATION

BACKGROUND OF THE INVENTION

1. Field of the Invention

This invention relates to the field of semiconductor processing and, more particularly to a method for isolating transistors after formation of the transistor devices.

2. Description of the Relevant Art

In a metal-oxide-semiconductor (MOS) integrated circuits, a plurality of transistors are fabricated within and upon a monolithic semiconductor substrate typically comprised of doped silicon. To effectively isolate individual transistors from one another so that the individual devices may be selectively interconnected to achieve a desired function, isolation structures must be included in the integrated circuit. In the absence of adequate isolation structures, an individual transistor could undesirably become electrically coupled to a neighboring transistor. Such undesirable and unpredictable coupling of transistors within a semiconductor can render the device non-functional.

Fabrication of a metal-oxide-semiconductor ("MOS") transistor is well-known. Fabrication begins by lightly doping a single crystal silicon substrate n-type or p-type. A gate dielectric may be formed by oxidizing the silicon substrate. Oxidation is generally performed in a thermal oxidation furnace or, alternatively, in a rapid thermal anneal ("RTA") apparatus. A gate conductor is then patterned from a layer of polycrystalline silicon ("polysilicon") deposited upon the gate dielectric. The polysilicon is rendered conductive by doping it with ions from an implanter or a diffusion furnace. The gate conductor is patterned using a mask followed by exposure, development, and etching. Subsequently, source and drain regions are doped, via ion implantation, with a high dosage n-type or p-type dopant. If the source and drain regions are doped n-type, the transistor is referred to as NMOS, and if the source and drain regions are doped p-type, the transistor is referred to as PMOS. A channel region between the source and the drain is protected from the implant species by the pre-existing gate conductor. When voltage above a certain threshold is applied to the gate of an enhancement-mode transistor, the channel between the source and drain becomes conductive and the transistor turns on.

NMOS remained the dominant MOS technology as long as the integration level of devices on a chip was sufficiently low. NMOS is somewhat inexpensive to fabricate, functionally dense, and faster than PMOS. NMOS logic gates (i.e., inverters) draw DC power during one of the inverter states. Therefore, an NMOS integrated circuit will draw a steady current even when being operated in the standby mode (i.e., even when no signal is being propagated through the circuit). During the modern VLSI era, power consumption in NMOS circuits began to exceed tolerable limits. A lower power technology was needed to exploit the VLSI techniques. Complimentary MOS ("CMOS") represented such a technology. CMOS is called so because it uses a combination of an NMOS transistor with a PMOS transistor. Therefore, in a CMOS inverter (unlike in an NMOS inverter) only one of the two transistors is driven at any one time. This means that when a CMOS inverter is not switching from one state to the other, a high impedance path exists from the supply voltage to ground, regardless of the state the inverter is in. Hence, virtually no current flows, and almost no DC power is dissipated. CMOS thus allows the manufacture of circuits with standby power on the order of microwatts.

For a CMOS integrated circuit, both NMOS and PMOS type transistors must be fabricated on the same wafer. On a given substrate which is initially doped n-type or p-type, only one type of transistor can be formed. To accommodate the device type that cannot be built on this substrate, regions of a doping type opposite of that present in the starting material must be formed. The regions of opposite doping, called wells (or sometimes tubs), are the first features to be defined on a starting wafer. This can be accomplished by implanting and then diffusing an appropriate dopant to attain the proper well depth and doping profile. For an initially n-type substrate a p-type dopant such as boron is used to form a p-well, while for an initially p-type substrate an n-type dopant such as phosphorus or arsenic is used to form an n-well.

Historically, the predominant MOS transistor isolation method has been the local oxidation (LOCOS) process. In the LOCOS process, as is well known in the field of semiconductor processing, a relatively thick thermal oxide film is formed between the source drain regions of neighboring transistor devices. The thermally grown oxide film, commonly referred to as the field oxide, consumes silicon within the silicon substrate surface such that the field oxide tends to form partially within and partially upon the silicon substrate. More specifically, approximately 45% of a field oxide film will extend into the silicon substrate while the remaining 55% grows above the silicon substrate upper surface. Field oxide formation is suppressed in regions of the silicon substrate wherein active devices will subsequently be formed by depositing a layer of silicon nitride over the active regions prior to the formation of the field oxide. The silicon nitride is typically deposited on a thin "pad" oxide to relieve the stress that silicon nitride films impart to a silicon surface. The thick field oxide film serves to isolate active regions displaced on either side of the field oxide film. To enhance the isolation capabilities of the field oxide, an implant is commonly performed to introduce impurities into a region under the field oxide. The polarity or conductivity type of the impurity introduced under the field oxide film is opposite the conductivity type of the subsequently formed source/drain regions.

Typical LOCOS field oxide films grow with a characteristic bird's beak structure that extends partially into the active regions of the neighboring transistors. This encroachment upon the transistor active region by the field oxide structure coupled with the portion of the field oxide that forms above the semiconductor substrate surface result in a non-planar surface upon which the transistors must be subsequently formed. As the geometries of semiconductor devices decrease below the sub 0.5 micron range, the planarity of the surface upon which transistors are formed becomes increasingly important. For example, short-channel effects (SCE), which can result in increased subthreshold leakage, can become exaggerated when transistors are formed upon a non-planar surface.

One method of improving the planarity of MOS isolation structures is the shallow trench isolation (STI) process. In an STI process, a trench is etched into the silicon substrate and subsequently filled with a dielectric material, typically an oxide. A planarization step is then performed to remove the oxide from regions exterior to the isolation trench. Ideally, the upper surface of the semiconductor substrate is completely planar after the planarization of the trench dielectric. Although the STI process is theoretically capable of producing a planar surface upon which transistors can be formed, significant processing is required to achieve the planar surface prior to the formation of the transistors. Specifically, it may be necessary to perform a number of chemical-mechanical polish steps, possibly in combination with some selective masking steps and some plasma etch steps to achieve the desired planarity. The incorporation of these processing steps prior to the formation of a gate dielectric is generally undesirable because of the increased potential for generating defects in critical regions of the silicon substrate and because of the high particle counts associated with these planarization processing steps.

In both the LOCOS process and the STI process, the isolation dielectric must be formed with an initial thickness substantially greater than the final desired thickness of the film. The additional film thickness is necessary because of the presence of subsequent processing steps that reduce the isolation dielectric thickness. More specifically, the typical transistor formation process includes cleaning and wafer preparation steps that require immersion in hydrofluoric acid ("HF"). In addition, the incorporation of "spacer" structures into many MOS processes necessitates a spacer etch step. The HF dip process steps and spacer etch process step attack the isolation dielectric and reduce the isolation film thickness. Thus, the original film thickness must be increased to compensate for these film reducing process steps. Since thicker films generally require more processing time, the need to overgrow or "over deposit" the isolation dielectric is an undesirable result. In addition, the numerous post-formation processing steps that attack the isolation dielectric make it more difficult to control the final film thickness. To accommodate the film thickness variations that can result because of the multiple processing steps that etch the isolation dielectric, the process specification must be relaxed. Generally, it is more desirable to have a narrow specified range for any given process parameter to reduce the variability in the operating characteristics of the finished product.

Therefore, it is desirable to implement a semiconductor process in which the gate dielectric and subsequent transistor formation processing steps are performed upon a planar silicon substrate without requiring a significant increase in the pre-transistor formation processing. It is also desirable to reduce or eliminate the number of oxide etch steps to which the isolation dielectric is subjected. It is further desirable to reduce the amount of dopants contaminating the trench dielectric. When the trench is formed early in the process, the trench dielectric is exposed to all subsequent ion implantations and thermal anneals which may introduce dopants into the trench dielectric. Such dopants may change the dielectric constant of the trench dielectric and reduce its insulating capabilities.

SUMMARY OF THE INVENTION

The problems identified above are in large part addressed by a semiconductor process in which the isolation structure is formed subsequent to the formation of the transistor devices. By delaying the formation of the isolation structure until after the transistor formation, the improved process hereof provides a planar surface upon which to form the transistors without requiring a significant increase in pre-transistor formation or "front end" processing. By providing a planar surface, the present invention enables the precise formation of submicron transistor regions. In addition, the improved process, by forming the isolation dielectric after transistor formation, reduces the amount by which the isolation dielectric must be formed in excess of the desired film thickness and reduces therewith the final film thickness variability. The trench dielectric is protected from dopants that may change its dielectric constant and reduce its insulation capabilities.

Broadly speaking, the present invention contemplates a method for isolating semiconductor devices. A semiconductor substrate is provided having a first pair of source/drain regions laterally displaced on either side of a first channel region and a second pair of source/drain regions laterally displaced on either side of a second channel region. One of the first pair of source/drain regions is proximal to one of the second pair of source/drain regions. First and second MOS transistors are subsequently formed, laterally displaced from one another, within the semiconductor substrate. An isolation trench is then formed between the proximal source/drain regions. The trench is then filled with a dielectric material to electrically isolate the proximal source/drain regions so that the first transistor is electrically isolated from the second transistor.

In a presently preferred embodiment, the formation of the laterally displaced first and second transistors comprises forming a gate dielectric layer on an upper surface of the semiconductor substrate and forming a conductive layer on the gate dielectric layer. Next, a portion of the gate conductive layer is selectively removed over the source/drain regions of the semiconductor substrate. A first concentration of a first impurity is then introduced into the first pair of source/drain regions and a second concentration of a second impurity is introduced into the second pair of source/drain regions. The gate dielectric is preferably comprised of a thermal oxide film having a thickness between 25 and 200 angstroms. The gate conductive layer typically comprises heavily doped, chemical vapor deposited (CVD) polysilicon. The first and second source/drain impurities typically comprise boron, arsenic, or phosphorus ions. The isolation trench preferably includes substantially vertical sidewalls and a trench floor which is substantially parallel to an upper surface of the semiconductor substrate. The trench preferably has a depth of approximately 1500 to 2500 angstroms.

In one embodiment, a first well implant is introduced into the semiconductor substrate prior to forming the first CMOS transistor. A first well region encompasses the first CMOS transistor. A second well implant may be introduced into the semiconductor substrate prior to forming a second CMOS transistor. A second well region encompasses the second CMOS transistor. Forming the shallow trench electrically isolates the first well region from the second well region. The formation of the first and second transistors results in CMOS type transistors of opposite conductivity type.

The present invention further contemplates a method of fabricating a semiconductor device. A semiconductor substrate having a first pair of source/drain regions on either side of a first channel region and a second pair of source/drain regions on either side of a second channel region in an upper region of the substrate is provided. One of the first pair of source/drain regions is proximal to one of the second pair of source/drain regions. First and second gate structures are then formed on the semiconductor substrate over the first and second channel regions respectively. A first and a second impurity are then introduced into first and second source/drain regions. The first and second impurities substantially reside above a first depth below an upper surface of the semiconductor substrate. A trench, laterally displaced between the proximal source/drain regions, is formed in the semiconductor substrate. The trench has a floor situated at a trench depth below the upper surface of the semiconductor substrate. Preferably, the trench depth is greater than the first depth. Subsequently, the trench is filled with a dielectric material whereby the proximal source/drain regions are divided into electrically isolated source/drain regions.

Preferably, the formation of the gate structures on the semiconductor substrate comprises forming a gate dielectric layer on an upper surface of the semiconductor substrate, forming a conductive layer on the gate dielectric layer and selectively removing portions of the gate conductive layer over the source/drain regions. In one embodiment, the first and second gate structures include a pair of substantially vertical sidewalls. Spacer structures are formed on the sidewalls to shadow peripheral portions of the source/drain regions. In this embodiment, a third and fourth impurity are introduced into the source/drain regions. The third and fourth impurities substantially reside within a region of the upper surface above a second depth below the substrate. Preferably, the third and fourth impurities are present in the semiconductor substrate in a greater concentration than the first and second impurities and the second depth is greater than the first depth.

In one embodiment, a first well implant is introduced into the semiconductor substrate prior to forming the first CMOS transistor. A first well region is encompasses the first CMOS transistor. A second well implant may be introduced into the semiconductor substrate prior to forming the second CMOS transistor. A second well region encompasses the second CMOS transistor.

The present invention still further contemplates a semiconductor structure comprising a semiconductor substrate having a substrate conductivity type. An upper region of the semiconductor substrate includes a trench-shaped void. The semiconductor substrate further includes first and second pairs of source/drain regions in the upper region of the semiconductor substrate. One of the first pair of source/drain regions is proximal to one of the second pair of source/drain regions. The trench-shaped void is laterally displaced between the first and second source/drain regions. The trench-shaped void extends from an upper surface of the semiconductor substrate to a trench floor substantially parallel to the upper surface. The trench-shaped void preferably has a depth of approximately 1500 to 2500 angstroms. Preferably, the trench-shaped void contains a trench dielectric having an upper region that is free of the first impurity.

BRIEF DESCRIPTION OF THE DRAWINGS

Other objects and advantages of the invention will become apparent upon reading the following detailed description and upon reference to the accompanying drawings in which.

Figure 1:
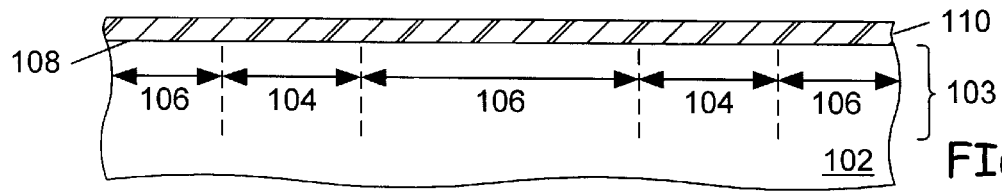
FIG. 1 is a partial cross-sectional view of a semiconductor substrate upon which a gate dielectric layer has been formed.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Figure 6:
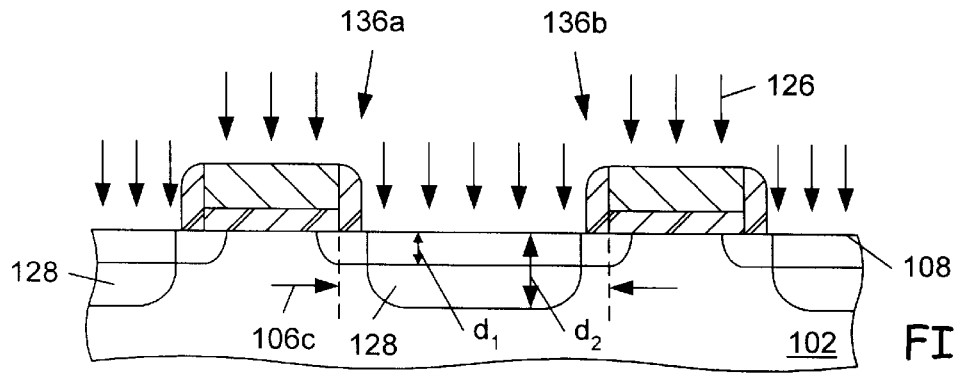
FIG. 6 is a processing step subsequent to FIG. 5 in which a second impurity has been introduced into the source/drain regions of the semiconductor substrate.
Figure 7:
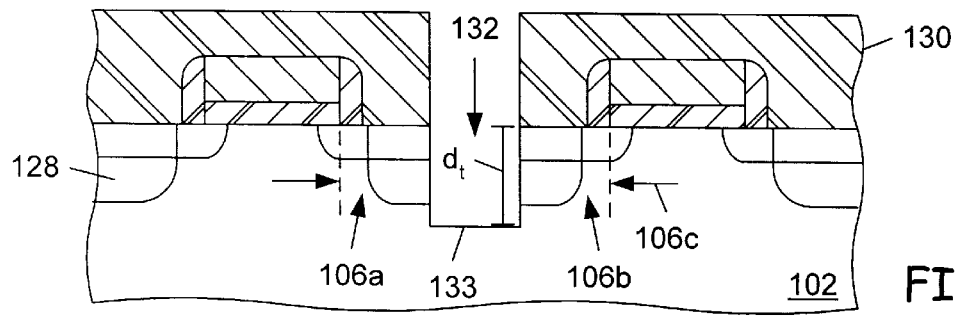
FIG. 7 is a processing step subsequent to FIG. 6 in which a photoresist layer has been deposited on the semiconductor topology and a trench dielectric formed through a portion of the common source/drain region.
Figure 8:
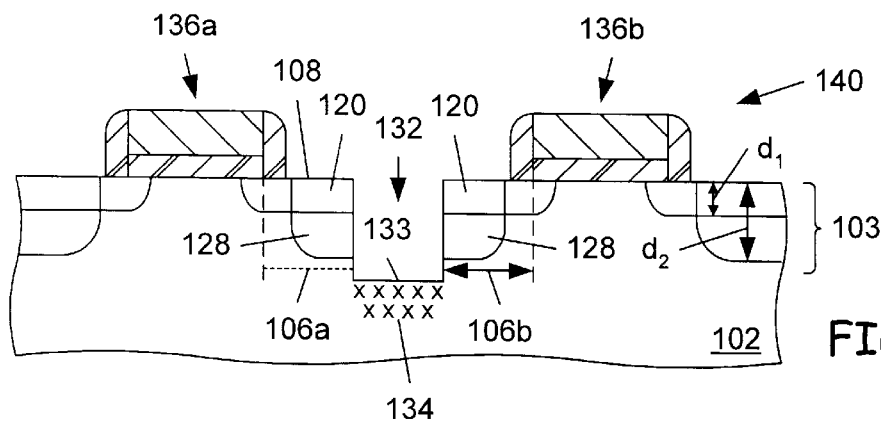
FIG. 8 is a processing step subsequent to FIG. 7 showing a channel stop impurity introduced into the semiconductor substrate below the isolation trench.

Turning now to the drawings, FIGS. 1–9 depict a presently preferred embodiment of a sequence of processing steps used to form a pair of isolated transistors partially formed within a monolithic semiconductor substrate. Turning briefly to FIG. 8, semiconductor structure 140 is shown. Structure 140 includes semiconductor substrate 102 having an upper region 103 that includes a trench-shaped void 132. Structure 140 further includes a first and second source/drain region 106a and 106b of a first and second transistor 136a and 136b respectively partially within upper region 103 of substrate 102. First and second source/drain regions 106a and 106b include a first concentration 120 of a first impurity. The first impurity has a conductivity type opposite to a conductivity type of semiconductor substrate 102. Trench-shaped void 132 is laterally displaced between first source/drain region 106a and second source/drain region 106b.

Trench-shaped void 132 extends from upper surface 108 of substrate 102 to trench floor 133. In the embodiment shown in FIG. 8, structure 140 further includes a second concentration 128 of a second impurity having a like conductivity type as the first impurity. Preferably, first concentration 120 of the first impurity is substantially confined to a portion of upper region 103 above a first depth $d_1$ (FIG. 6) below upper surface 108. Second concentration 128 of the second impurity is substantially confined to a portion of upper region 103 above a second depth $d_2$ (FIG. 6) below upper surface 108 of substrate 102. In the preferred embodiment, trench floor 133 is situated at a depth $d_t$ (FIG. 7) below upper surface 108 of substrate 102. In the presently preferred embodiment, $d_t$ is greater than $d_2$ which is greater than $d_1$.

Figure 2:
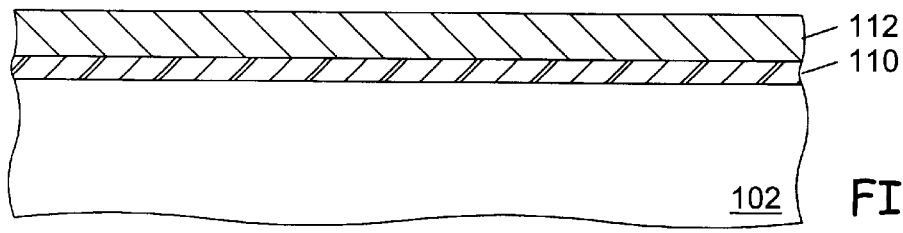
FIG. 2 is a processing step subsequent to FIG. 1 in which a gate conductive layer has been formed on the gate dielectric layer.

Returning to FIG. 1, a process sequence is shown for forming structure 140. In FIG. 1, a gate dielectric layer 110 is formed on upper surface 108 of semiconductor substrate 102. Semiconductor substrate 102 is preferably comprised of monolithic single crystal silicon. Upper region 103 of semiconductor substrate 102 includes laterally displaced channel regions 104 and source/drain regions 106. In the presently preferred embodiment, gate dielectric layer 110 comprises a thermally grown silicon dioxide ($SiO_2$) film ranging in thickness from 25 to 200 angstroms. Turning to FIG. 2, gate conductive layer 112 is formed upon gate dielectric layer 110. Gate conductive layer 112 is preferably comprised of heavily doped chemically vapor deposited polysilicon as is well known in the art. For purposes of this disclosure, "heavily doped polysilicon" includes any polysilicon film having a sheet resistivity of 500 $\Omega$/sq or less.

Figure 3:
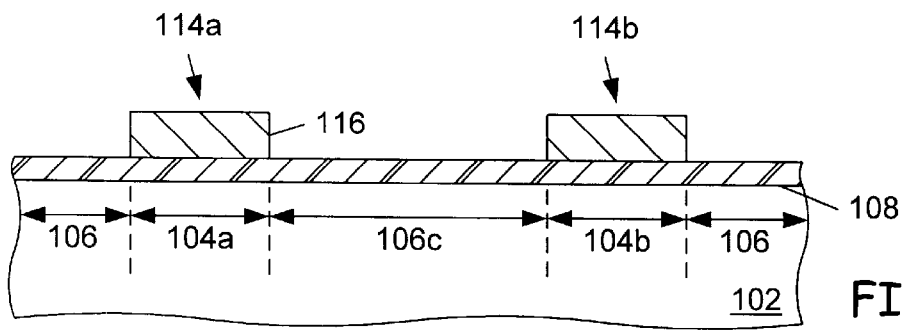
FIG. 3 is a processing step subsequent to FIG. 2 in which portions of the gate conductive layer have been selectively removed over the source/drain regions of the semiconductor substrate.
Figure 4:
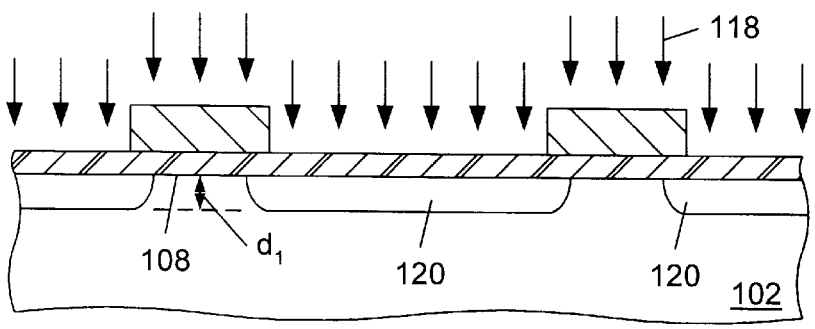
FIG. 4 is a processing step subsequent to FIG. 3 in which a first impurity is introduced into the source/drain regions of the semiconductor substrate.

Turning to FIG. 3, portions of gate conductive layer 112 are selectively removed over source/drain regions 106 of substrate 102. Selective removal of portions of gate conductive layer 112 results in the formation of first gate structure 114a and second gate structure 114b. In a presently preferred embodiment, gate structures 114a and 114b include sidewalls 116 which are substantially perpendicular to upper surface 108 of substrate 102. First gate structure 114a is formed over first channel region 104a while second gate structure 114b is formed over second channel region 104b of substrate 102. As shown in FIG. 3, substrate 102 includes common source/drain region 106a laterally displaced between first channel region 104a and second channel region 104b. Turning to FIG. 4, a first concentration 120 of a first impurity is introduced into source/drain regions 106 of substrate 102 including common source/drain region 106c. First concentration 120 resides substantially above a first depth $d_1$ below upper surface 108 of substrate 102. In one embodiment of the invention, first concentration 120 comprises the lightly doped drain (LDD). The introduction of first concentration 120 into substrate 102 is preferably accomplished with an ion implantation step, shown in the FIG. 4 as reference 118. Impurities used to form first concentration 120 preferably include phosphorus and arsenic for N-channel devices and boron for P-channel devices.

Figure 5:
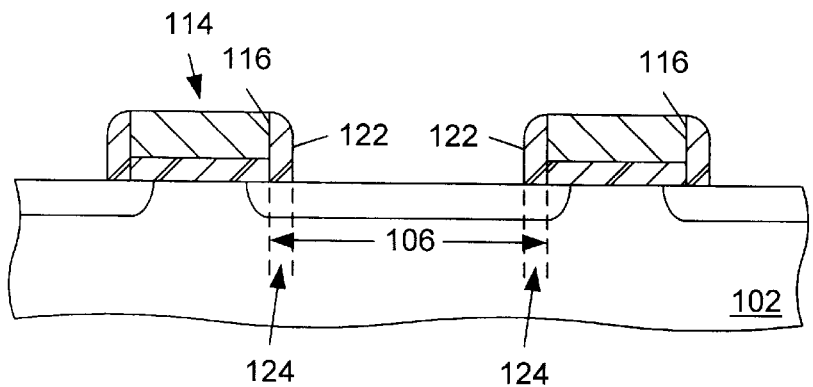
FIG. 5 is a processing step subsequent to FIG. 4 in which spacer structures have been formed on the sidewalls of the gate structures.

Turning now to FIG. 5, an optional processing step is shown for an embodiment in which it is desired to implement LDD transistors. FIG. 5 shows spacer structures 122 formed on sidewalls 116 of gate structures 114. In a preferred embodiment, spacer structure 122 is formed by blanket depositing a CVD oxide film on the semiconductor topology of FIG. 4 and performing an anisotropic plasma etch purposefully leaving behind spacer structures 122 on sidewalls 116. Spacer structures 122 effectively shadow peripheral portions 124 of channel regions 106. Turning to FIG. 6, a second concentration 128 of a second impurity is introduced into portions of source/drain regions 106 not shadowed by spacer structures 122. Second concentration 128 substantially resides within a region of semiconductor substrate 102 above a second depth $d_2$ below upper surface 108 of substrate 102. As shown, FIG. 6 discloses laterally displaced first transistor 136a and second transistor 136b formed partially within substrate 102 and having a common source/drain region 106a.

Turning to FIG. 7, isolation trench 132 is formed in semiconductor substrate 102 laterally displaced within common source/drain region 106c. Trench 132 is formed to a depth $d_t$ wherein $d_t$ is greater than $d_1$ and $d_2$ such that trench floor 133 resides below first concentration 120 and second concentration 128. Trench 132 therefore physically divides common source/drain region 106c into first source/drain region 106a and second source/drain 106b. In a presently preferred embodiment, trench 132 is formed by depositing photoresist layer 130, selectively removing portions of photoresist layer 130 with a conventional photolithography sequence, and plasma etching the regions of silicon substrate 102 exposed by the removed photoresist, all as is well known in the art. To further improve the isolation of first source/drain region 106a and second source/drain region 106b, impurities 134 (shown in FIG. 8) are introduced into semiconductor substrate 102 under trench floor 133 of trench 132. Impurities 134 are of a like conductivity type as semiconductor substrate 102 and of an opposite conductivity type from first concentration 120 and second concentration 128 of source/drain regions 106. Masking layer 130 can alternatively be comprised of a dielectric such as CVD oxide. In a preferred embodiment, the depth $d_t$ of trench 132 is approximately 1500 to 2500 angstroms. The trench can be formed at this relatively shallow range because the isolation dielectric will not be subjected to the numerous oxide etch steps incorporated into the transistor formation process. FIG. 8 shows a subsequent processing step in which masking layer 130 has been removed.

Figure 9:
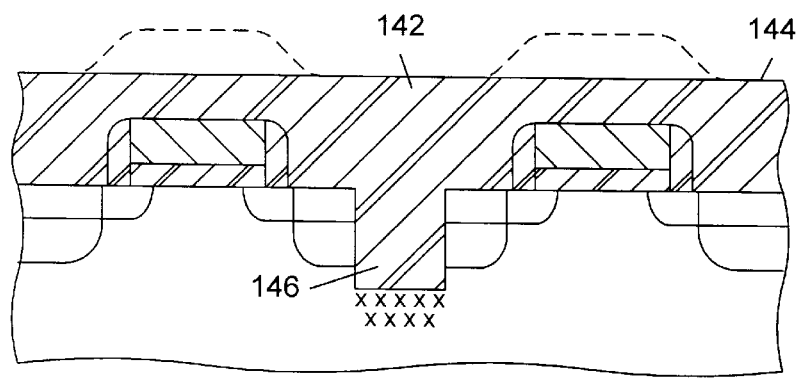
FIG. 9 is a processing step subsequent to FIG. 8 in which the isolation trench has been filled with a dielectric material and the dielectric material has been subsequently planarized.

Turning to FIG. 9, the process sequence is completed by filling trench-shaped void 132 with dielectric material 142. Dielectric material 142 preferably comprises a CVD oxide. FIG. 9 depicts dielectric 142 after completion of a planarization process, preferably a chemical-mechanical polish possibly in combination with photolithography masking steps and dry etch processing, such that dielectric material 142 has a substantially planar upper surface 144. Dielectric material 142 removed by the planarization process is shown in FIG. 9 in phantom. Because trench dielectric 146, which comprises trench material 142 within trench-shaped void 132, is formed after the formation of first transistor 136a and second transistor 136b, trench dielectric 146 is free of impurities used to form first concentration 120 and second concentration 128. Because conventionally formed isolation dielectrics are subjected to subsequent implantation steps including source/drain implants, threshold adjust implants, and channel stop implants, trench dielectric 146 is distinguishable. In a presently preferred embodiment, trench dielectric 146 has a thickness of approximately 1500 to 8000 angstroms.

Figure 10:
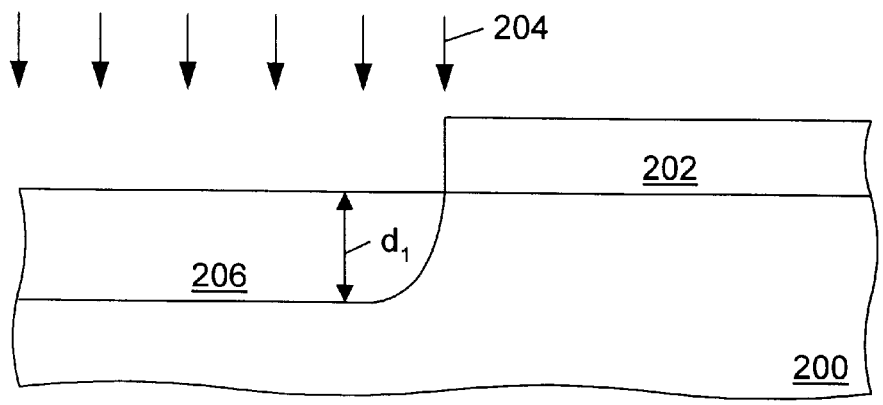
FIG. 10 is partial cross-sectional view of a semiconductor substrate into which a first well region is formed.

In an alternative embodiment of the invention, a CMOS pair of transistors is formed and subsequently electrically isolated by a shallow trench. FIG. 10 shows a partial cross-sectional view of semiconductor substrate 200. Semiconductor substrate 200 preferably comprises lightly doped n-type or p-type single-crystalline silicon with a minimum doping concentration of $3\times10^{14}$–$1\times10^{15}$ atoms/cm$^3$. For the formation of CMOS type devices, a well of opposite conductivity type to the substrate must be formed into the substrate. That is, n-type wells must be formed in a p-type substrate by an n-type implant while p-wells must be formed in an n-type substrate by implanting a p-type dopant. The well dopant concentration needs to be five to ten times higher than the substrate dopant concentration ($10^{15}$–$10^{16}$ atoms/cm$^3$). Photoresist layer 202 is deposited upon the semiconductor substrate and then patterned to expose a portion of the upper surface of semiconductor substrate 200. The exposed portion of the upper surface is where the well will be subsequently formed. Either n-type or p-type dopants are then implanted into the exposed portion of semiconductor substrate 200 to form well 206. The remaining portion of photoresist 202 is then removed and the wafer is thermally annealed in order to activate and diffuse the well dopants.

Figure 11:
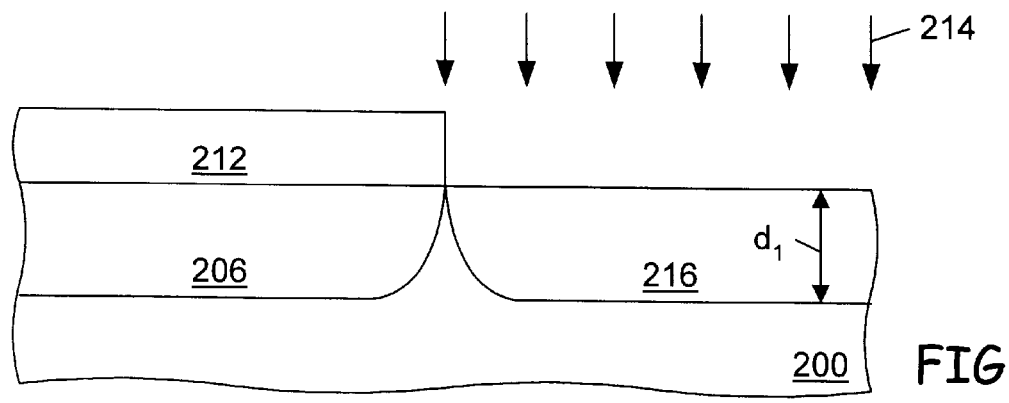
FIG. 11 is a processing step subsequent to FIG. 10 in which second well region is formed into the semiconductor substrate.
Figure 12:
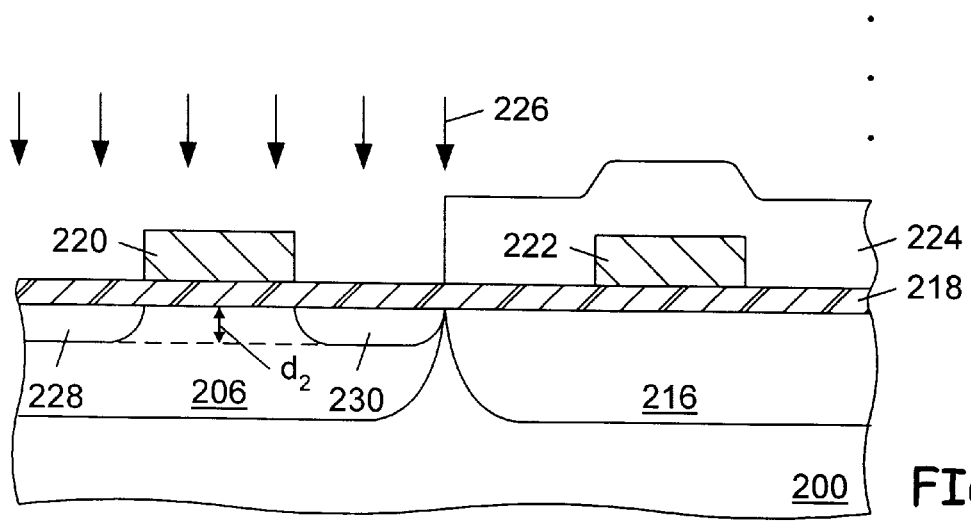
FIG. 12 is a partial cross-sectional of a semiconductor substrate showing the formation of a first pair of LDD regions using ion implantation.

Turning now to FIG. 11, an optional second well implant may be performed. The optional second well implant may be performed in order to adjust the dopant concentration of substrate 200. Photoresist layer 212 is deposited upon the semiconductor topography and then patterned to expose a portion of the semiconductor substrate which is complementary to the portion exposed in FIG. 10. Dopants 214 are then preferably implanted into semiconductor substrate 200 to form second well region 216. Second well region 216 is in electrical contact with well region 206. Dopants 214 can be of the same conductivity type as semiconductor substrate 200, in which case the dopant concentration of second well region 216 will increase. Dopants 214 can be of opposite type to the semiconductor substrate in which case the effective dopant concentration of second well region 216 will decrease. The remaining portion of photoresist 212 is then removed and the wafer is thermally annealed in order to activate and diffuse the second well dopants.

The CMOS transistors are then partially formed upon semiconductor substrate 200 according to processing steps shown in FIGS. 1 through 3. During these steps, gate dielectric layer 218 and gate structures 220 and 222 are formed. First and second transistors and their source/drain regions are subsequently implanted with opposite conductivity type implants. Photoresist layer 224 is deposited upon semiconductor substrate 200 and then patterned to expose gate structure 220 and the source/drain areas immediately adjacent to the structure. Dopants 226 are then forwarded into gate structure 220 and into the exposed portion of semiconductor substrate 200 to form lightly doped drain ("LDD") regions 228 and 230. Impurities 226 are introduced at a depth $d_1$ below the upper surface of semiconductor substrate 200. Dopants 226 are of the same type as semiconductor substrate 200 and the of the opposite type to the dopants used to form well 206. Phosphorus and arsenic are preferably used as n-type dopants and boron is preferably used as a p-type dopant. Photoresist 224 is then completely removed.

Figure 13:
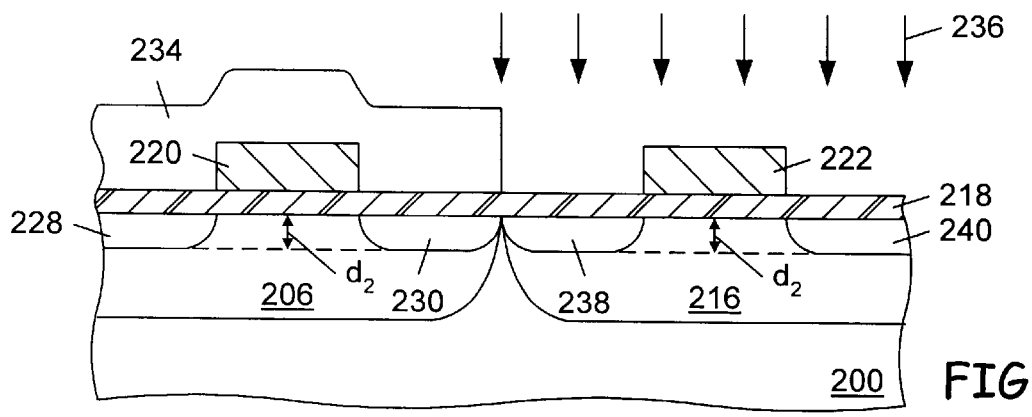
FIG. 13 is a processing step subsequent to FIG. 12 in which a second pair of LDD regions is formed with ion implantation.

Turning now to FIG. 13, photoresist layer 234 is deposited upon semiconductor substrate 200 and then patterned to expose gate structure 222 and the source/drain areas immediately adjacent to the structure. Dopants 236 are then forwarded into gate structure 230 and into the exposed portion of semiconductor substrate 200 to form LDD regions 238 and 240. LDD region 238 is in electrical contact with LDD region 230. Impurities 236 are introduced at a depth $d_2$ below the upper surface of semiconductor substrate 200. Dopants 226 are of the opposite type as semiconductor substrate 200. Phosphorus and arsenic are preferably used as n-type dopants and boron is preferably used as a p-type dopant. Photoresist 224 is then completely removed. The wafer may be then thermally annealed in order to activate and diffuse the dopants.

Figure 14:
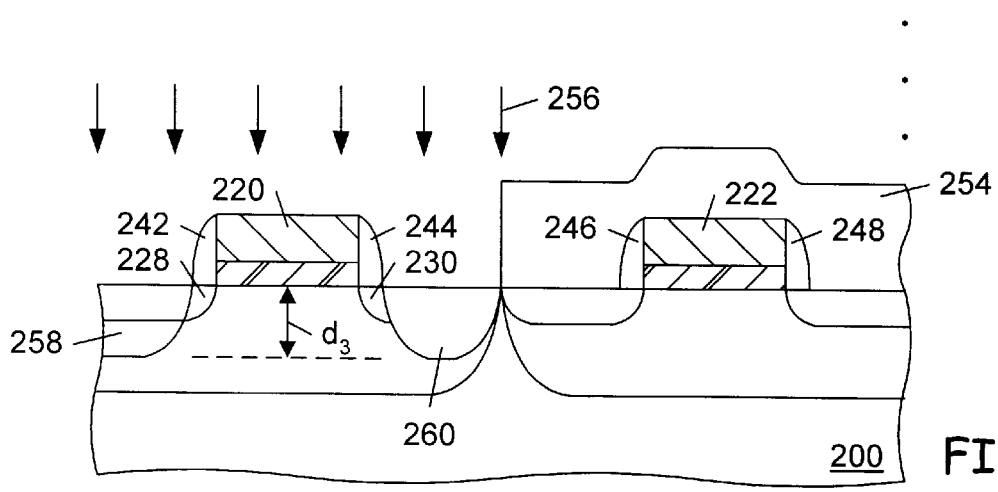
FIG. 14 is a partial cross-sectional view of a semiconductor substrate showing the formation of a first pair of source/drain regions using ion implantation.

Turning now to FIG. 14, protective oxide spacers are formed upon the sidewall surfaces of the gate structures according to processing steps shown in FIG. 5. During these steps, spacer structures 242, 244, 246, and 248 are formed upon the sidewall surfaces of gate structures 220 and 222. Photoresist layer 254 is deposited and then patterned to expose a portion of the semiconductor topography. Dopants 256 are subsequently implanted into gate structure 220 and into the regions of semiconductor substrate 200 proximal to spacer structures 242 and 244. Dopants 256 are implanted at a higher energy and are at a higher dosage compared to dopants 226. As a result source/drain regions 258 and 260 are created into semiconductor substrate 200 at a distance $d_3$ below the upper surface. Distance $d_3$ is greater than distance $d_2$. Dopants 256 are of the same conductivity type as dopants 226.

Figure 15:
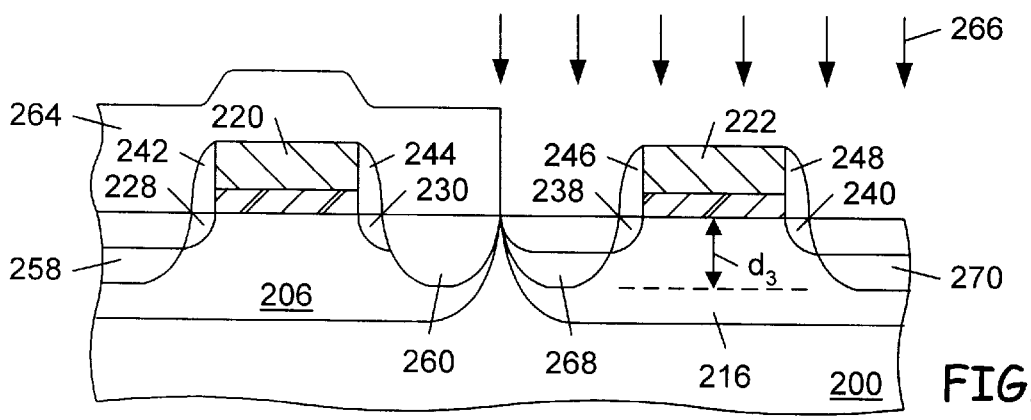
FIG. 15 is a processing step subsequent to FIG. 14 in which a second pair of source/drain regions is formed with ion implantation.

Turning now to FIG. 15, photoresist layer 264 is deposited and then patterned to expose a portion of the semiconductor topography. Dopants 266 are subsequently implanted into gate structure 222 and into the regions of semiconductor substrate 200 proximal to spacer structures 246 and 248. Dopants 256 are implanted at a higher energy and are at a higher dosage compared to dopants 236. As a result source/drain regions 268 and 270 are created into semiconductor substrate 200 at a distance $d_3$ (shown in FIG. 15) below the upper surface. Distance $d_3$ is greater than distance $d_2$. Dopants 266 are of the same type as dopants 236.

Figure 16:
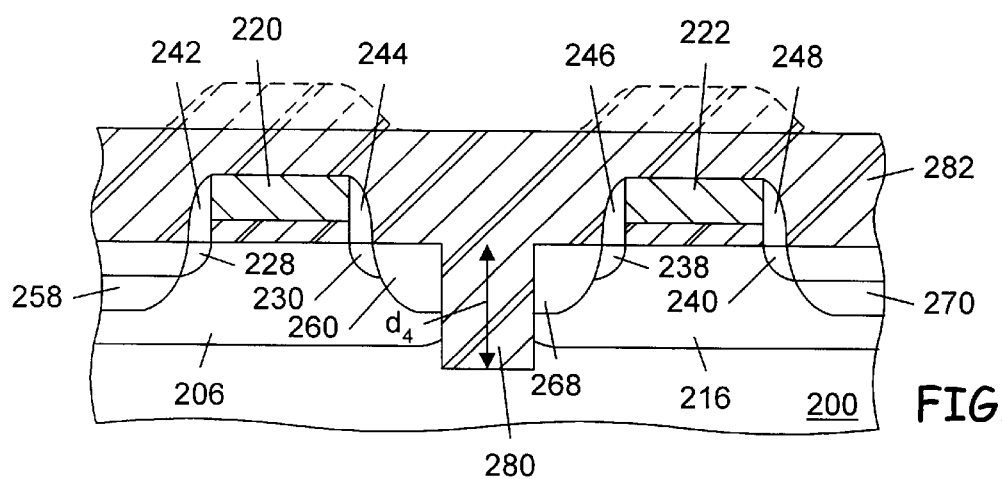
FIG. 16 is a partial cross-sectional view of a semiconductor substrate showing the formation of a shallow trench in order to electrically isolate the first well region from the second well region.

Similar processing steps to the ones shown in FIGS. 7, 8, and 9 are followed to arrive to the CMOS pair of transistors shown in FIG. 16. Trench 280 is formed laterally between the first and second transistors. Trench 280 extends a distance $d_4$ below the upper surface of semiconductor. Distance $d_4$ is greater than distances $d_1$, $d_2$, and $d_3$ so that trench 280 electrically isolates well implants 206 from second well implants 216 and source/drain region 260 from source/drain region 268. Deposited dielectric 282 further improves the electrical isolation properties of trench 280 and further serves as a first-level interlevel dielectric.

Figure 17:
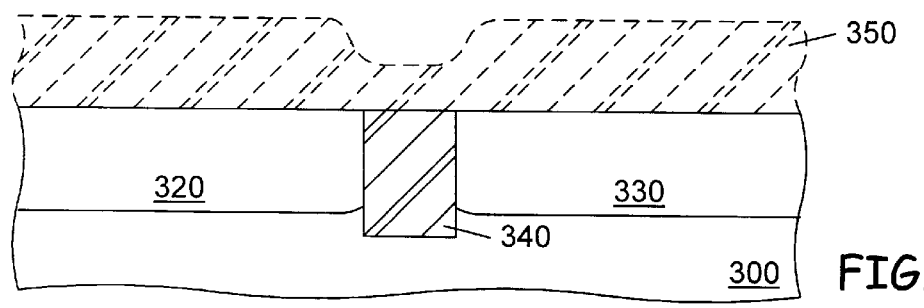
FIG. 17 is a partial cross-sectional view of a semiconductor substrate showing the deposition and planarization of a trench dielectric.

Turning now to FIG. 17, another embodiment of the invention is shown. Trench 290 may be formed immediately after the implantation of well dopants 204 and second well dopants 214. The dopant implantation is performed according to processing steps described in FIGS. 10 and 11. Trench 290 electrically isolates well implant region 206 from second well implant region 216. Trench dielectric 292 is preferably TEOS deposited by CVD which is planarized after deposition so that the upper surface of the trench dielectric is at the same level as the upper surface of semiconductor substrate 300. Depositing trench dielectric 350 after implanting well region 320 and second well region 330 ensures that the dielectric is free of dopants. Dopants can be introduced into dielectric 350 either directly during the ion implantation process or during the thermal anneal performed to activate the implants. The introduction of impurities may change the value of the dielectric constant of trench dielectric 350 and decrease its insulating capabilities. A pair of transistors is subsequently formed in each of the well and second well region according to processing steps shown in FIGS. 12–16.

It will be appreciated to those skilled in the art having the benefit of this disclosure that this invention is capable of providing a method for forming a transistor upon a planar semiconductor substrate surface prior to the formation of an isolation structure. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method for isolating semiconductor devices, comprising:

providing a semiconductor substrate, wherein said semiconductor substrate includes a first pair of source/drain regions laterally displaced on either side of a first channel region and a second pair of source/drain regions laterally displaced on either side of a second channel region, and wherein one of said first pair of source/drain regions is proximal to one of said second pair of source/drain regions;

introducing a first well impurity concentration into a first well region of said semiconductor substrate wherein a depth of said first well region is greater than a depth of said first pair of source/drain regions and wherein said first well region encompasses said first pair of source/drain regions;

introducing a second well impurity concentration into a second well region of said semiconductor substrate wherein a depth of said second well region is greater than a depth of said second pair of source/drain regions and wherein said second well region encompasses said second pair of source/drain regions;

after introducing said first and second well impurity concentrations, forming laterally displaced first and second MOS transistors partially within said semiconductor substrate, wherein a gate of said first MOS transistor is aligned over said first channel region and wherein a gate of second MOS transistor is aligned over said second channel region;

forming an isolation trench into said semiconductor substrate, wherein said trench is placed laterally between said proximal source/drain regions, wherein a depth of said trench is greater than a depth of said first and second pairs of source/drain regions; and filling said trench with a trench dielectric material such that said proximal source/drain regions are electrically isolated from one another whereby said first transistor is electrically isolated from said second transistor.

2. The method of claim 1 wherein the step of forming said laterally displaced first and second transistors comprises:

forming a gate dielectric layer on an upper surface of said semiconductor substrate;

forming a gate conductive layer on said gate dielectric layer;

selectively removing portions of said gate conductive layer over said first and second pairs of source/drain regions; and introducing a first concentration of a first source/drain impurity having a first conductivity type into said first pair of source/drain regions and a second concentration of a second source/drain impurity having a second conductivity type into said second pair of source/drain regions.

3. The method of claim 2 wherein said gate dielectric layer comprises a thermal oxide having a thickness between approximately 25 and 200 angstroms and wherein said conductive layer comprises heavily doped, chemical vapor deposited polysilicon.

4. The method of claim 1 wherein said isolation trench has a depth of approximately 1500 to 2500 angstroms.

5. The method of claim 1 wherein said isolation trench includes substantially vertical sidewalls and a trench floor substantially parallel to said upper surface of said semiconductor substrate.

6. The method of claim 1 further comprising introducing a channel stop impurity into a portion of said semiconductor substrate below said isolation trench, wherein said channel stop impurity and said portion of said semiconductor substrate below said isolation trench are of like conductivity type.

7. The method of claim 1 wherein the step of forming said shallow trench electrically isolates said first well region from said second well region.

8. The method of claim 1 wherein the step of forming said first and said second MOS transistors results in a CMOS pair of transistors of opposite conductivity type.

9. The method of claim 1 wherein the step of forming said isolation trench is performed after introducing said first well implant and said second well implant and prior to forming said first and second MOS transistors.

10. A method of fabricating a semiconductor device, comprising:

providing a semiconductor substrate, an upper region of said semiconductor substrate comprising a first pair of source/drain regions laterally displaced on either side of a first channel region and a second pair of source/drain regions laterally displaced on either side of a second channel region, and wherein one of said first pair of source/drain regions is proximal to one of said second pair of source/drain regions;

forming a first and a second gate structure on said semiconductor substrate aligned over said first and second channel regions respectively;

introducing a first concentration of a first impurity into said first pair of said source/drain regions and a second concentration of a second impurity into said second pair of said source/drain regions, wherein said first and said second concentrations of said first and said second impurity concentrations substantially reside above a first depth below an upper surface of said semiconductor substrate and wherein said first and second impurities are of dissimilar conductivity and shape;

forming a trench in said semiconductor substrate wherein said trench is laterally displaced between said proximal source/drain regions, wherein a floor of said trench is situated at a trench depth below said upper surface of said semiconductor substrate, and wherein said trench depth is greater than said first depth; and filling said trench with a trench dielectric material whereby said proximal source/drain regions are electrically isolated from one another.

11. The method of claim 10 wherein the step of forming said first and second gate structures comprises:

forming a gate dielectric layer on said upper surface of said semiconductor substrate;

forming a gate conductive layer on said gate dielectric layer; and selectively removing portions of said gate conductive layer over said first and said second pairs of source/drain regions.

12. The method of claim 11 wherein said gate dielectric layer comprises a thermal oxide approximately 25 to 200 angstroms in thickness and wherein said gate conductive layer comprises heavily doped, chemically vapor deposited polysilicon.

13. The method of claim 10 wherein said trench depth is approximately 1500 to 2500 angstroms.

14. The method of claim 10 wherein said first and second gate structures each include a pair of sidewalls substantially perpendicular to said upper surface of said semiconductor substrate, and wherein said method further comprises:

forming spacer structures on said pairs of sidewalls of said first and second gate structures wherein said spacer structures effectively shadow peripheral portions of said first and second pairs of source/drain regions respectively; and introducing a third concentration of a third impurity into said first pair of source/drain regions and a fourth concentration of a fourth impurity into said second pair of source/drain regions, wherein said third concentration of a third impurity and said fourth concentration of a fourth impurity are substantially excluded from said peripheral portions of said first and said second pairs of source/drain regions and wherein said third and said fourth concentration substantially reside within a region of said upper surface above a second depth below said substrate.

15. The method of claim 14 wherein said third and said fourth concentrations are greater than said first and said second concentrations and wherein said second depth is greater than said first depth.

16. The method of claim 14 wherein said trench depth is greater than said second depth.

17. The method of claim 10 further comprising introducing a first well impurity concentration into a first well region of said semiconductor substrate, prior to forming said laterally displaced first MOS transistor, wherein a depth of said first well region is greater than a depth of said first pair of source/drain regions and wherein said first well region encompasses said first pair of source/drain regions.

18. The method of claim 17, further comprising introducing a second well impurity concentration into a second well region of said semiconductor substrate, prior to forming said laterally displaced second MOS transistor, wherein a depth of said second well region is greater than a depth of said second pair of source/drain regions and wherein said second well region encompasses said second pair of source/drain regions.

19. The method of claim 18 wherein the step of forming said isolation trench is performed after said introduction of the first well implant and second well implant and prior to forming said first and second gate structures.

* * * * *